United States Patent
Ernst et al.

(10) Patent No.: US 9,449,877 B2
(45) Date of Patent: Sep. 20, 2016

(54) METHOD OF PROTECTING A MOUNTING TAPE DURING LASER SINGULATION OF A WAFER

(71) Applicants: Frank Ernst, Votrum-Mullem (NL); Rogier Evertsen, Arnhem (NL); Raph Pieters, Bergen (NL); Mark Müller, Bietigheim-Bissingen (DE); Guido Knippels, Schijndel (NL)

(72) Inventors: Frank Ernst, Votrum-Mullem (NL); Rogier Evertsen, Arnhem (NL); Raph Pieters, Bergen (NL); Mark Müller, Bietigheim-Bissingen (DE); Guido Knippels, Schijndel (NL)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 14/488,675

(22) Filed: Sep. 17, 2014

(65) Prior Publication Data
US 2016/0079118 A1    Mar. 17, 2016

(51) Int. Cl.
*H01L 21/78*   (2006.01)
*H01L 21/428*   (2006.01)
*H01L 23/00*   (2006.01)

(52) U.S. Cl.
CPC ............ *H01L 21/78* (2013.01); *H01L 21/428* (2013.01); *H01L 24/03* (2013.01); *H01L 2224/03009* (2013.01)

(58) Field of Classification Search
CPC .................. H01L 21/6386; H01L 21/68764; H01L 21/68757; H01L 2224/03009; H01L 24/03; H01L 21/428; H01L 21/78
See application file for complete search history.

(56) References Cited

U.S. PATENT DOCUMENTS

| | | | |
|---|---|---|---|
| 8,912,075 B1* | 12/2014 | Lei et al. ...................... | 438/460 |
| 8,932,939 B1* | 1/2015 | Lei et al. ...................... | 438/462 |
| 8,991,329 B1* | 3/2015 | Park et al. .................... | 118/500 |
| 9,054,176 B2* | 6/2015 | Lei et al. | |
| 2006/0219351 A1* | 10/2006 | Kuan et al. ................... | 156/247 |
| 2011/0065238 A1* | 3/2011 | Chiou et al. .................. | 438/107 |
| 2012/0108035 A1* | 5/2012 | Kim et al. ..................... | 438/463 |
| 2014/0167266 A1* | 6/2014 | Schneegans et al. ......... | 257/741 |
| 2014/0242780 A1* | 8/2014 | Gauldin et al. ............... | 438/463 |
| 2015/0104929 A1* | 4/2015 | Lei et al. ...................... | 438/462 |

* cited by examiner

*Primary Examiner* — Latanya N Crawford
(74) *Attorney, Agent, or Firm* — Ostrolenk Faber LLP

(57) ABSTRACT

A method of singulating a semiconductor wafer with laser energy while the semiconductor wafer is supported on a mounting tape during singulation comprises the step of depositing a coating material onto a portion of the mounting tape adjacent to a perimeter of the semiconductor wafer to form a protective layer over the mounting tape. The semiconductor wafer is then cut with a laser beam such that the laser beam at least partially impinges upon the protective layer during cutting of the semiconductor wafer. After singulation of the semiconductor wafer, the protective layer is removed from the mounting tape.

16 Claims, 2 Drawing Sheets

METHOD OF PROTECTING A MOUNTING TAPE DURING LASER SINGULATION OF A WAFER

FIELD OF THE INVENTION

The invention relates to semiconductor wafer singulation, and in particular, to semiconductor wafer singulation conducted on a wafer that is mounted onto an adhesive tape.

BACKGROUND AND PRIOR ART

Laser cutting of semiconductor wafers comprising a plurality of semiconductor dice is commonly used as an efficient and accurate die-singulation process. Such laser cutting may be conducted by cutting completely through the wafer in a process called dicing or by forming grooves in the wafer in a process called grooving. The wafer that needs to be singulated is mounted onto a special mounting tape, which may be in the form of a polymer adhesive mounting tape that holds the individual dice in place during the singulation process. Additionally, the singulated dice are also held in place after laser singulation when the wafer and the tape are transferred to the next tool for further processing. There are many different types of adhesive mounting tape available depending on the application. Many of these tapes are curable by exposure to ultra-violet ("UV") light, so that the adhesive forces between the mounting tape and the singulated dice are reduced after the said exposure. This allows the singulated dice to be removed more easily from the mounting tape.

When UV laser radiation (such as by applying a laser beam having a wavelength of 355 nm) is used in the die singulation process, it is a challenge to combine the desirable UV-curing properties with sufficient resistance to UV laser radiation to avoid damage to the UV-resistant mounting tape during laser cutting. Although some UV-resistant mounting tapes exist that combine these characteristics (being both UV curable and UV laser-resistant), the range of available UV-resistant mounting tapes is very limited and the costs of these UV-resistant mounting tapes are very high, thereby limiting the use of UV dicing for the purpose of mass production.

As a result, semiconductor manufacturers resort to the use of these exotic tapes only for applications that can tolerate the additional cost of the UV-resistant mounting tape. Alternatively, solutions based on green or infrared laser have been developed, but they are inferior when compared to a UV laser singulation solution, since they result in larger kerf-widths, more recast and larger burrs.

FIG. 1 illustrates a semiconductor wafer 10 mounted on an adhesive mounting tape 12 and a number of cutting lines 14 along which a laser beam 16 moves to cut the semiconductor wafer 10. The adhesive mounting tape 12 is in turn attached to a rigid frame 18 which supports the adhesive mounting tape 12 for fixedly securing the semiconductor wafer 10 during laser cutting and for transportation of the semiconductor wafer 10.

During the singulation process, the laser beam 16 should cut the semiconductor wafer 10 all the way until the edge of the semiconductor wafer 10. However, the actual cutting lines 14 typically extend onto the adhesive mounting tape 12. If the cutting lines 14 extend outside a perimeter of the semiconductor wafer 10, or if the laser beam 16 inadvertently exceeds the wafer edge by a small distance, the laser beam 16 would impinge into and deposit its laser energy into the adhesive mounting tape 12 and this may damage the adhesive mounting tape 12. Accordingly, the adhesive mounting tape 12 should be able to resist the focused laser beam 16 without incurring excessive damage. For UV laser cutting applications, this requires expensive custom-made mounting tapes. The laser beam 16 may comprise a single laser beam, or may comprise multiple laser beams. The latter is adaptable to cut along multiple cutting lines 14 simultaneously.

If special UV-resistant adhesive mounting tapes are to be avoided, the singulation machine has to be sufficiently accurate so that laser-cutting stops exactly at the boundary of the semiconductor wafer 10. This is difficult to achieve in practice, and even if feasible, would place additional requirements on the accuracy and performance of the singulation machine. If either the adhesive mounting tape is punctured, the singulation machine cuts over the edge of the semiconductor wafer 10, or where a non-cut portion appears at the outer-edge of the semiconductor wafer 10, it complicates wafer expansion for the purpose of separating the dice comprised in the semiconductor wafer 10 prior to picking up the dice.

Hence, at present, there is a severe limitation in the choice of suitable adhesive mounting tapes to support UV laser wafer singulation applications. This means that an end-user has to adopt newer and much more expensive UV-resistant mounting tapes for this purpose. The change to UV-resistant mounting tape would not only require requalification of the singulation process, but since the UV-resistant mounting tape would be used on multiple tools in the semiconductor assembly and packaging process, requalification of the said process on other tools would also be required. In general, this becomes a very significant barrier for an end-user to consider adopting a UV laser singulation process, even though the singulation results might be superior and more cost-effective.

Even if the end-user decides to use such novel UV-curable and UV laser-resistant mounting tapes, any unintended cuts in the mounting tape is considered undesirable, since the UV-resistant mounting tape may still be punctured and lead to the loss of wafers, either in the singulation machine itself or during subsequent die-picking steps. These risks are further increased when high-power and multi-pass UV laser singulation processes are used.

Furthermore, in laser-singulation applications where multiple cutting lines are cut simultaneously, it is extremely difficult to avoid cutting into the mounting tape. Since the wafer is circular in shape, the various cutting lines that are simultaneously cut have different end points at the edge of the wafer. Independent control over starting and stopping of each laser beam would be required for each cutting line that is cut. It would therefore be advantageous to avoid the need for such precise control for multiple-lane cutting with a UV laser.

SUMMARY OF THE INVENTION

It is thus an object of the invention to seek to provide an effective and cost-effective method of cutting wafers using laser energy which avoids damaging the adhesive mounting tape on which the wafers are mounted.

According to a first aspect of the invention, there is provided a method of singulating a semiconductor wafer with laser energy while the semiconductor wafer is supported on a mounting tape during singulation, the method comprising the steps of: depositing a coating material onto a portion of the mounting tape adjacent to a perimeter of the semiconductor wafer to form a protective layer over the mounting tape; cutting the semiconductor wafer with a laser beam such that the laser beam at least partially impinges upon the protective layer during cutting of the semiconductor wafer; and thereafter removing the protective layer from the mounting tape after singulation of the semiconductor wafer.

According to a second aspect of the invention, there is provided a method of protecting a mounting tape supporting a semiconductor wafer from damage during laser singulation of the semiconductor wafer, comprising the steps of depositing a coating material onto a portion of the mounting tape adjacent to a perimeter of the semiconductor wafer to form a protective layer over the mounting tape prior to laser singulation.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a method of protecting a mounting tape during laser singulation in accordance with the invention will now be described with reference to the accompanying drawings, in which.

DETAILED DESCRIPTION OF THE PREFERRED EMBODIMENT OF THE INVENTION

Figure 1:
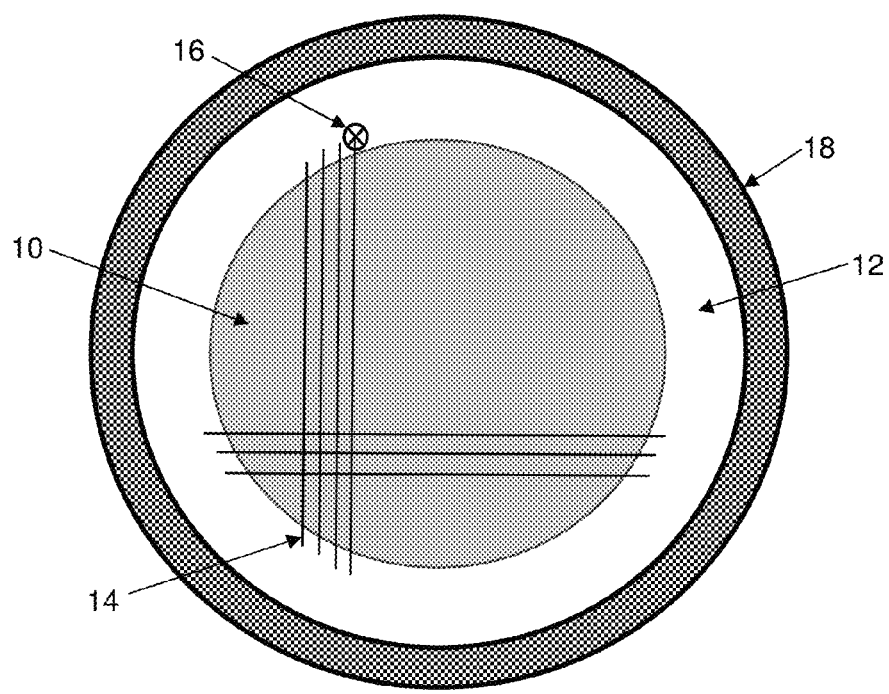
FIG. 1 illustrates a semiconductor wafer mounted on an adhesive mounting tape and a number of cutting lines along which a laser beam moves to cut the wafer.
Figure 2:
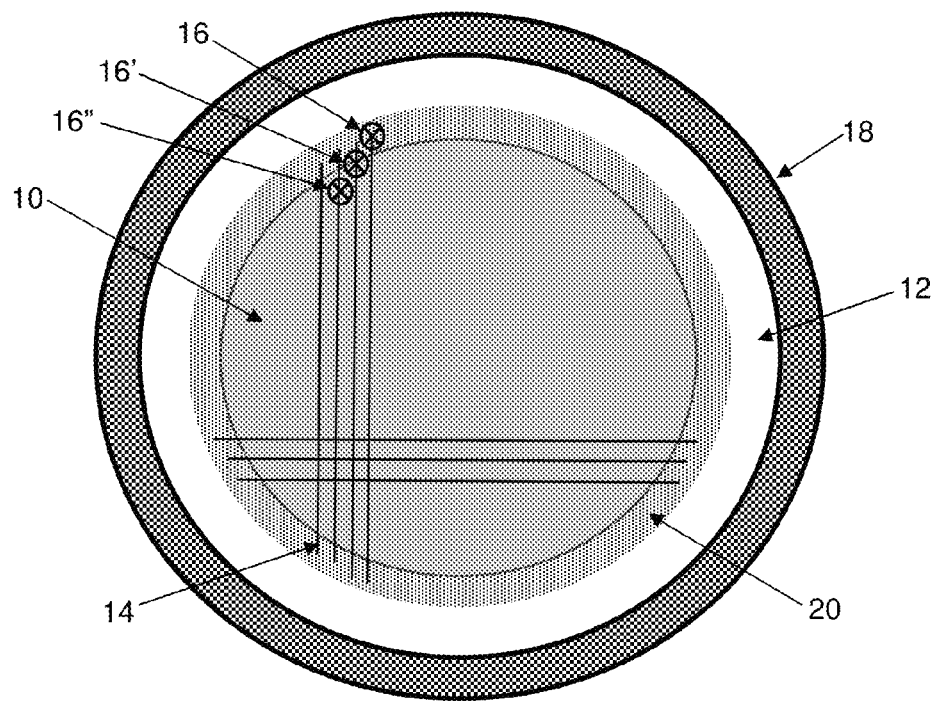
FIG. 2 illustrates a protective layer coated on the adhesive mounting tape adjacent to a perimeter of the semiconductor wafer for protecting the adhesive mounting tape.

FIG. 2 illustrates a protective layer 20 coated on the adhesive mounting tape 12 adjacent to a perimeter of the semiconductor wafer 10 for protecting the adhesive mounting tape 12 during laser singulation. Laser singulation may be performed by dicing or grooving. The laser beam used has an ultraviolet ("UV") wavelength. Additional laser beams 16', 16" may also be used during singulation for cutting multiple points simultaneously.

The coating material used to form the protective layer 20 is selected to be in viscous form when deposited but hardens when set, and is also easily removable after use. The protective layer 20 preferably surrounds a whole perimeter of the semiconductor wafer 10 to protect the adhesive mounting tape 12 against harmful incident laser beams such as UV laser radiation that would normally damage the adhesive mounting tape 12 when the laser beam 16 moves beyond the boundary of the edge of the semiconductor wafer 10. By forming the protective layer 20, the semiconductor wafer 10 can be cut fully up to its edge, while avoiding the risk of damaging the adhesive mounting tape 12. Accordingly, there is also no need for an end-user to use a different type of adhesive mounting tape 12 solely for the purpose of switching to wafer singulation using UV laser.

A suitable coating material may comprise a water-soluble base material, such as a poly(vinylalcohol), poly(vinylacetate), poly(vinylacrylate), poly (ethyleneglycol) or similar (or a mixture thereof), enhancement agents such as wetting agents, preservatives and surfactants, and/or a colouring agent, such as an agent with absorbing, scattering or reflecting properties particularly in the UV wavelength range. The relevant properties in the coating material that protect the mounting tape 12 may include, without limitation, a material that absorps, reflects and/or scatters the laser beam 16 to reduce a laser intensity that is incident on the mounting tape 12 to a level that is below a damage threshold of the mounting tape 12.

An example of a suitable coating material having at least some of the aforesaid properties is BMK W300 coating material from ASM™. BMK W300 coating material can also be used as a coating to protect wafers from debris during laser cutting. The main difference is that a thicker layer of such coating material (which may range from a thickness of at least 10 microns up to several hundred microns) is deposited around the edge of the wafer to protect the adhesive mounting tape 12. When used as a coating on the wafer surface to protect the semiconductor wafer 10 from debris, a thinner layer which is 1 to 3 microns thick would generally be sufficient. Nevertheless, it should be appreciated that the invention is not limited to the coating material as described above.

The deposition of a protective ring around the edge of the wafer protects the adhesive mounting tape 12 against laser-induced damage. With the presence of the protective layer 20, even if the cutting lines 14 extend outside the perimeter of the semiconductor wafer 10, the laser beam 16 would impinge upon the protective layer 20 but not the adhesive mounting tape 12. Therefore, since the adhesive mounting tape 12 would be protected from damage even if the laser beam 16 impinges upon an area outside the perimeter of the semiconductor wafer 10, the cutting of the semiconductor wafer 10 may be safely performed by the laser beam 16 at least partially impinging upon the protective layer 20 during laser singulation.

Figure 3:
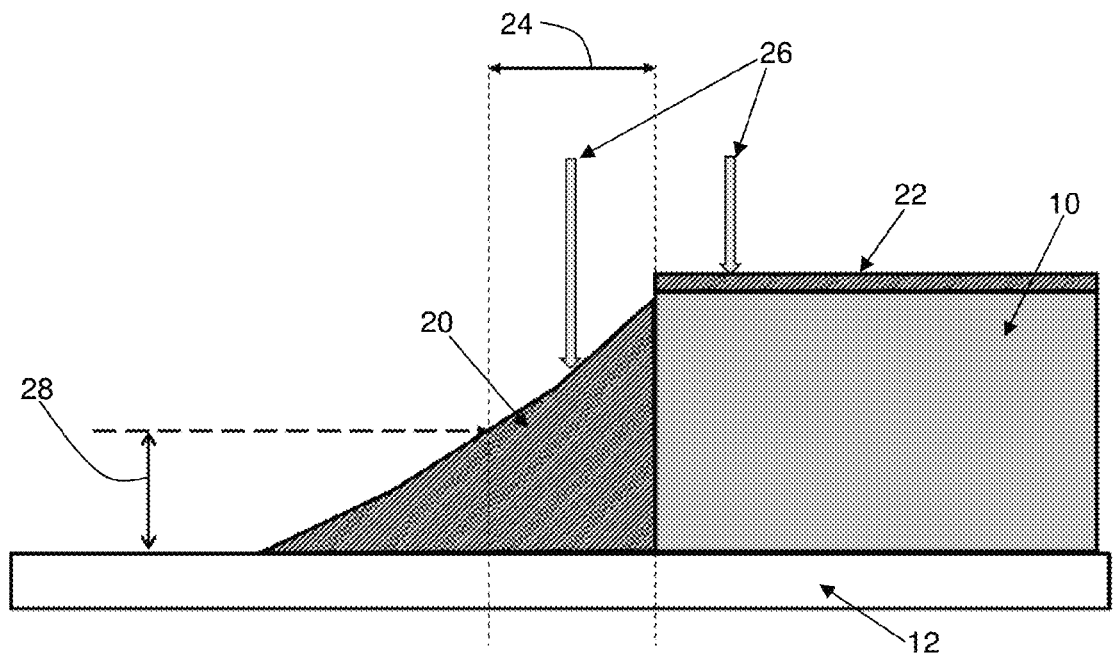
FIG. 3 is a cross-sectional view of an edge of the wafer which shows the protective layer which is coated onto the adhesive mounting tape adjacent to the edge of the wafer.

FIG. 3 is a cross-sectional view of an edge of the semiconductor wafer 10 which shows the protective layer 20 which is coated onto the adhesive mounting tape 12 adjacent to the perimeter of the semiconductor wafer 10. The thickness of the protective layer 20 is shown solely for the purposes of illustration and is not drawn to scale.

The semiconductor wafer 10 is supported by the adhesive mounting tape 12. A top surface of the semiconductor wafer 10 is covered with a conventional thin (about 1 to 3 microns) coating layer 22, which functions to protect the surface of the semiconductor wafer 10 from debris that is generated during the laser cutting process. Additionally, a thicker layer of the coating material is directly coated onto the adhesive mounting tape 12 to form the protective layer 20 next to the edge of the semiconductor wafer 10. The protective layer 20 extends for a sufficient distance along the adhesive mounting tape 12 adjacent to the semiconductor wafer 10 so as to fully cover an anticipated run-out area 24 from the impinging laser beam 16. The protective layer 20 has a minimum thickness 28 (of at least 10 microns) covering the run-out area 24 where the laser 26 may potentially impinge upon the adhesive mounting tape 20. It preferably covers a full circumference around the edge of the wafer, and adjoins the perimeter of the semiconductor wafer 10.

However, the thickness of the protective layer 20 next to the semiconductor wafer 10 need not necessarily be the same as the height of the semiconductor wafer 10. The protective layer 20 may thus have a height that is higher or lower than the top surface of the semiconductor wafer 10, and the thickness of the protective layer 20 may depend on its required minimum thickness 28.

Figure 4:
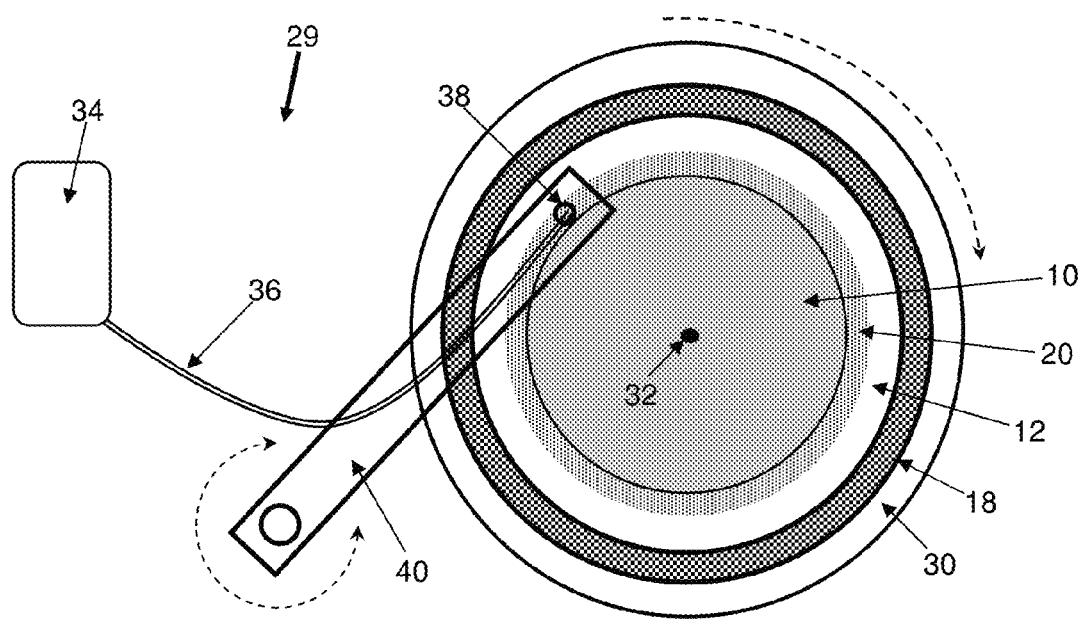
FIG. 4 is a plan view of a coating unit for depositing a protective layer adjacent to the perimeter of the wafer.

FIG. 4 is a plan view of a coating unit 29 for depositing a protective layer 20 adjacent to the perimeter of the semiconductor wafer 10. The coating unit 29 controllably deposits an appropriate amount of coating material around the circumference of the wafer edge to achieve a predetermined thickness.

The semiconductor wafer 10 is mounted on the adhesive mounting tape 12 which is held by the rigid frame 18, and the assembly is vacuum-clamped on a supporting chuck 30. The supporting chuck 30 is configured to be rotatable about a vertical axis 32 in order the rotate the semiconductor wafer 10 and the mounting tape 12. A rotation speed and duration of rotation of the supporting chuck 30 is controllable by an external controller (not shown).

The area occupied by the protective layer 20 should be large enough to cover a full anticipated run-out area 24 of the laser 26. The coating material is dispensed through a nozzle 38 that is positioned over the mounting tape 12 onto areas adjacent to the edge of the semiconductor wafer 10. The nozzle 38 controllably dispenses coating material to form a sufficiently thick protective layer 20 for protecting the underlying adhesive mounting tape 12. The coating thickness is controllable by the amount of coating material that is dispensed onto the adhesive mounting tape 12. For instance, the semiconductor wafer 10 may be rotated by the supporting chuck 30 at slower rate to create a thicker protective layer 20.

Suitable coating material is pumped from a coating supply container 34 by means of an electrical pump (not shown). The coating material is pumped through a flexible tube 36 to the nozzle 38 and is dispensed through the nozzle 38 onto the adhesive mounting tape 12 adjacent to the edge of the semiconductor wafer 10. To deposit coating material along the mounting tape 12 to cover an anticipated run-out area of the laser beam 16, a relative distance between the nozzle 38 and the perimeter of the semiconductor wafer 10 can be changed by moving a pivotable arm 40 on which the nozzle 38 is supported relative to the semiconductor wafer 10. By controlling the rotation speed of the supporting chuck 30, motion of the pivotable arm 40 and the amount of coating material dispensed by the nozzle 38, an appropriate dispensation of the coating material is realized.

The time that is required to allow the coating material to dry after it has been dispensed can be shortened by the use of an electrical heater or integrated hot plate that is incorporated in the supporting chuck 30. Such an electrical heater may be used to raise the temperature of the supporting chuck 30, the semiconductor wafer 10 and the coating material in a controlled fashion. Heating serves to accelerate the drying of the coating material to allow it to set.

After singulation of the semiconductor wafer 10, the protective layer 20 is removed from the mounting tape 12 by washing off the coating material with a liquid. In order to simplify the removal process, the coating material that is used is ideally water-soluble, so that water may be used for such washing. Thus, after wafer singulation, the coating material may be easily washed off with water using a standard cleaning unit.

It should be appreciated that the wafer singulation process according to the preferred embodiment of the invention makes it possible in principle to cut wafers using UV laser with any adhesive mounting tape 12, since the adhesive mounting tape 12 is protected from damage from the laser beam 16 without the need to customize the UV-resistant properties of the adhesive mounting tape 12. Hence, this approach removes a significant barrier to the adoption of wafer singulation using UV laser, which can achieve superior singulation results at a lower cost.

Moreover, the preferred embodiment of the invention facilitates laser cutting along multiple cutting lines simultaneously since the necessity to stop laser cutting precisely at the edges of the semiconductor wafer 10 to avoid damage to the adhesive mounting tape 12 is avoided. The method is especially useful when additional laser beams 16', 16" are generated for cutting the semiconductor wafer 10 at different points simultaneously.

Further, the said approach requires minimal new hardware investment and uses existing coating material (such as BMK W300) that is relatively inexpensive and is commonly available. Additional hardware in the form of coating-cleaning units to form and to remove the protective layer 20, and possibly a hot-plate to speed up drying of the coating material is sufficient. When water-soluble coating material is used, the coating material may be removed from the adhesive mounting tape 12 in the same cleaning step that is already employed for standard wafer cleaning procedures using water in conventional singulation machines.

The invention described herein is susceptible to variations, modifications and/or additions other than those specifically described and it is to be understood that the invention includes all such variations, modifications and/or additions which fall within the spirit and scope of the above description.

The invention claimed is:

1. A method of singulating a semiconductor wafer with laser energy while the semiconductor wafer is supported on a mounting tape during singulation, the method comprising the steps of:
   depositing a coating material directly onto a portion of the mounting tape adjacent to a perimeter of the semiconductor wafer to form a protective layer covering the mounting tape, the protective layer being deposited with a predetermined thickness sufficient to protect the mounting tape from being cut by the laser beam;
   cutting the semiconductor wafer with a laser beam such that the laser beam at least partially impinges upon the protective layer covering the mounting tape during cutting of the semiconductor wafer; and thereafter
   removing the protective layer from the mounting tape after singulation of the semiconductor wafer.

2. The method as claimed in claim 1, wherein the coating material is deposited such that the protective layer surrounds a whole perimeter of the semiconductor wafer.

3. The method as claimed in claim 1, wherein the step of removing the protective layer from the mounting tape comprises the step of washing off the coating material with a liquid.

4. The method as claimed in claim 3, wherein the liquid is water.

5. The method as claimed in claim 1, wherein the coating material comprises a material that absorps, reflects and/or scatters the laser beam to reduce a laser intensity that is incident on the mounting tape to a level that is below a damage threshold of the mounting tape.

6. The method as claimed in claim 5, wherein the coating material is selected from the group consisting of: a poly (vinylalcohol), a poly(vinylacetate), a poly(vinylacrylate), a poly(ethyleneglycol), a wetting agent, a preservative, a surfactant and a colouring agent.

7. The method as claimed in claim 1, wherein the protective layer has a thickness of at least 10 microns.

8. The method as claimed in claim 1, wherein the coating material is deposited along the mounting tape for a sufficient distance adjacent to the semiconductor wafer to cover an anticipated run-out area of the laser beam.

9. The method as claimed in claim 1, wherein the protective layer adjoins the perimeter of the semiconductor wafer.

10. The method as claimed in claim 1, wherein the step of depositing the coating material on the mounting tape further comprises the step of pumping coating material to a nozzle that is positioned over the mounting tape for controllably dispensing the coating material onto the mounting tape.

11. The method as claimed in claim 10, further comprising the step of supporting the semiconductor wafer and mounting tape on a supporting chuck, and rotating the supporting chuck, semiconductor wafer and mounting tape relative to the nozzle while dispensing coating material from the nozzle.

12. The method as claimed in claim 1, further comprising the step of heating the protective layer after dispensation of the coating material so as to accelerate drying of the coating material before cutting the semiconductor wafer.

13. The method as claimed in claim 1, wherein the laser beam has an ultraviolet wavelength.

14. The method as claimed in claim 1, wherein the step of cutting the semiconductor wafer further comprises the step of generating additional laser beams for cutting the semiconductor wafer at different points simultaneously.

15. A method of singulating a semiconductor wafer with laser energy while the semiconductor wafer is supported on a mounting tape during singulation, the method comprising the steps of:
 depositing a coating material onto a portion of the mounting tape adjacent to a perimeter of the semiconductor wafer to form a protective layer over the mounting tape;
 cutting the semiconductor wafer with a laser beam such that the laser beam at least partially impinges upon the protective layer during cutting of the semiconductor wafer; and thereafter
 removing the protective layer from the mounting tape after singulation of the semiconductor wafer;
 wherein the step of depositing the coating material on the mounting tape further comprises the step of pumping coating material to a nozzle that is positioned over the mounting tape for controllably dispensing the coating material onto the mounting tape; and
 further comprising the step of changing a relative distance between the nozzle and the perimeter of the semiconductor wafer so as to deposit the coating material along the mounting tape to cover an anticipated run-out area of the laser beam.

16. The method as claimed in claim 15, wherein the step of changing the relative distance between the nozzle and the perimeter of the semiconductor wafer comprises the step of moving a pivotable arm on which the nozzle is supported relative to the semiconductor wafer.

\* \* \* \* \*